United States Patent
Richter et al.

(10) Patent No.: US 6,887,653 B2
(45) Date of Patent: May 3, 2005

(54) METHOD FOR STRUCTURING A PHOTORESIST LAYER

(75) Inventors: Ernst-Christian Richter, Erlangen-Bruck (DE); Michael Sebald, Weisendorf (DE)

(73) Assignee: Infineon Technologies AG, Munich (DE)

( * ) Notice: Subject to any disclaimer, the term of this patent is extended or adjusted under 35 U.S.C. 154(b) by 16 days.

(21) Appl. No.: 10/134,146

(22) Filed: Apr. 29, 2002

(65) Prior Publication Data

US 2002/0160317 A1 Oct. 31, 2002

(30) Foreign Application Priority Data

Apr. 27, 2001 (DE) .......................................... 101 20 674

(51) Int. Cl.[7] ................................................ G03C 5/00
(52) U.S. Cl. ..................... 430/322; 430/324; 430/326; 430/330; 430/270.1
(58) Field of Search ................................ 430/322, 324, 430/326, 330, 270.1

(56) References Cited

U.S. PATENT DOCUMENTS

| | | | |
|---|---|---|---|
| 5,206,117 A | | 4/1993 | Labadie et al. |
| 5,266,424 A | * | 11/1993 | Fujino et al. .................. 430/5 |
| 5,650,261 A | | 7/1997 | Winkle |
| 6,017,683 A | * | 1/2000 | Endo et al. ................. 430/326 |
| 6,277,546 B1 | * | 8/2001 | Breyta et al. ................ 430/322 |
| 6,303,268 B1 | * | 10/2001 | Namba et al. ............ 430/270.1 |
| 6,479,209 B1 | * | 11/2002 | Aoai et al. ................ 430/270.1 |
| 6,517,990 B1 | * | 2/2003 | Choi et al. ................ 430/270.1 |
| 2001/0021479 A1 | * | 9/2001 | Kawabe et al. ............. 430/170 |
| 2002/0045122 A1 | * | 4/2002 | Iwasa et al. ............. 430/270.1 |
| 2002/0094488 A1 | * | 7/2002 | Imai et al. ................ 430/270.1 |

FOREIGN PATENT DOCUMENTS

| | | |
|---|---|---|
| DE | 100 54 121 A1 | 5/2002 |
| EP | 0 962 825 A1 | 12/1999 |
| GB | 2 354 596 A | 3/2001 |

OTHER PUBLICATIONS

Hiroshi Ito: "Deep–UV resists: Evolution and status", *Solid State Technology*, Jul. 1996, pp. 164–170.

* cited by examiner

*Primary Examiner*—Mark F. Huff
*Assistant Examiner*—Daborah Chacko-Davis
(74) *Attorney, Agent, or Firm*—Laurence A. Greenberg; Werner H. Stemer; Ralph E. Locher

(57) ABSTRACT

A method for structuring a photoresist layer is described. A substrate has a photoresist layer containing a film-forming polymer that has a photo acid generator that liberates an acid on exposure to light from a defined wavelength range $\Delta\lambda_1$. In addition, the polymer has a photo base generator that liberates a base on exposure to light from a defined wavelength range $\Delta\lambda_2$. The photoresist layer is first exposed in parts to light from the defined wavelength range $\Delta\lambda_1$, the light being chosen so that the photo base generator is substantially inert to the irradiation. The photoresist layer is then exposed to light from the defined wavelength range $\Delta\lambda_2$, the light being chosen so that the photo acid generator is substantially inert to the irradiation. The photoresist layer is then heated at which the cleavage reaction catalyzed by the photolytically produced acid takes place, and finally the photoresist layer is developed.

27 Claims, No Drawings

METHOD FOR STRUCTURING A PHOTORESIST LAYER

BACKGROUND OF THE INVENTION

Field of the Invention

The invention relates to a method for structuring a photoresist layer.

In semiconductor technology, photolithographic methods play a key role in the production of integrated circuits on a semiconductor substrate. Typically, photoresist layers are applied to the surface of the substrate to be structured and are then structured by exposure to radiation from a suitable wavelength range. The exposure for structuring is effected by a lithography mask that predetermines the structure that is to be transferred to the substrate. The exposed parts of the photoresist layer are chemically modified by the exposure and their polarity is thus changed. For this reason, the exposed and the unexposed parts of the photoresist have different solubilities in a corresponding developer. This is used in the subsequent development step for selectively removing the exposed or unexposed parts. Those parts of the photoresist layer that remain on the substrate serve in the following structuring step as a mask which protects the substrate layer underneath from removal of material or modification of material. Such a structuring step may be, for example, plasma etching, wet chemical etching or ion implantation.

Both in the case of the one-layer resists developable by a wet method and in the case of the two-layer resist systems developable completely or partly by a dry method, chemical amplification resists (CAR) have proven particularly useful as photoresists. Chemical amplification resists are characterized in that they contain a photo acid generator, i.e. a photosensitive compound, which generates a protic acid on exposure to light. The protic acid then initiates acid-catalyzed reactions in the base polymer of the resist, if necessary with thermal treatment of the resist. As a result of the presence of the photo acid generator, the sensitivity of the photoresist is substantially increased compared with a conventional photoresist. An overview of this topic is given by H. Ito in Solid State Technology, July 1996, page 164 et seq.

In the case of the positive resists, the different solubilities of the exposed and of the unexposed photoresist is achieved by the principle of acid-catalyzed cleavage. A polar carboxyl group is formed thereby from a nonpolar chemical group of the layer-forming polymer, for example a tert-butyl carboxylate group, in the presence of a photolytically produced acid, if necessary in a heating step.

Further examples of nonpolar "blocked" groups which can be converted into corresponding polar groups by acid-catalyzed reactions are the tert-butoxycarbonyloxy (t-BOC) or acetal groups. Through the conversion of the nonpolar group into the corresponding polar group, the resist undergoes a change in polarity in the previously exposed parts, with the result that it becomes soluble in the polar, aqueous alkaline developer. Consequently, the exposed parts of the photoresist can be selectively removed by the developer. The resist residues in the unexposed, nonpolar parts thus geometrically define a resist profile or a resist structure on the substrate, which serves in subsequent process steps as a mask for surface structuring.

In contrast, a reduction in the solubility of the photoresist in the exposed parts is caused by the exposure in negative resists. In order to achieve this, negative-working photoresists have, as a rule, cross-linkable groups that can undergo cross-linking reactions under the influence of irradiation. As a result of the cross-linking, the solubility of the exposed parts of the photoresist in a corresponding developer is reduced. The cross-linkable groups can be either directly bonded to the base polymer or be present as a separate cross-linking component in the photoresist. In chemically amplified, negative-working photoresists, groups which are cross-linkable under acid catalysis and are activated by the photolytically liberated acid are used.

Owing to the constantly increasing integration density in semiconductor technology, the accuracy with which the resist profile can be produced after development on a surface to be structured is of decisive importance. The resist profile is first physically uniquely predefined by the light distribution during the exposure. Second, it is chemically transferred to the resist layer by the distribution of the components produced photochemically by the exposure.

Owing to the physicochemical properties of the resist materials, completely unfalsified transfer of the pattern predetermined by the lithography mask to the resist is, however, not definitively possible. Here, in particular interference effects and light scattering in the photoresist play a major role. However, the steps following the exposure, such as, for example, the development, additionally have a considerable influence on the quality of the resist profiles, which is substantially determined by the profile sidewalls. In order to achieve surface structuring that is as precise as possible in the subsequent process steps, it would be ideal if it were possible to obtain virtually perpendicular, smooth profile sidewalls in the resist profile after development of the photoresist.

In particular, the light intensity profile that results in the photoresist during the exposure has an adverse effect on the steepness of the profile sidewalls that is to be achieved. This characteristic intensity profile, which is also referred to as "aerial" image, is due to the light scattering and light absorption occurring in the resist during exposure. Since the photoresist absorbs a certain proportion of the incident radiation, the observed radiation intensity decreases with increasing layer thickness in the photoresist. Consequently, those parts of the photoresist layer which are close to the surface are more strongly exposed. In the case of a positive resist, the parts that are close to the surface are thus more highly soluble than the parts away from the surface. The different solubilities within an exposed part of the resist often leads to a flattening and to poor definition of the profile sidewalls in the case of positive resists. The light intensity profile in the photoresist thus describes the distribution of a photochemically modified species, for example the distribution of the photolytically produced acid in the photoresist in the case of a positive resist.

In the case of negative resists, the decrease in the radiation intensity with increasing layer thickness in the photoresist leads to greater cross-linking in the parts which are close to the surface and which thus have a lower solubility than the parts away from the surface. In the subsequent development of the exposed photoresist, those parts of the photoresist layer which are away from the surface are thus dissolved to a greater extent than the parts on top which are close to the surface, with the result that the quality of the profile sidewalls and hence the resolution also deteriorate.

The quality and the steepness of the resist profiles are of decisive importance for the transfer of the structure from the photomask to the layer underneath which is to be structured. One known approach for improving the quality of resist profiles in positive resists is described in Published, European Patent Application EP 962 825 A. There, an improved steepness of the resist sidewalls is achieved by adding to the photoresist two photochemically active additives that are activated by radiation in different wavelength ranges in each case. First, the photoresist contains a photo acid generator which, as already described above, liberates an acid on exposure to light of a defined wavelength range, which acid then catalyzes the reaction of the convertible nonpolar groups of the layer-forming polymer of the photoresist to give carboxyl groups and hence causes the photoresist to be soluble in the polar developer. Second, the photoresist contains, as the second photochemical additive, a cross-linking reagent which results in a reduction of the solubility of the photoresist. The cross-linking reagent is likewise activated by radiation, the radiation used for this purpose differing from the radiation used for activating the photo acid generator.

According to Published, European Patent Application EP 962 825 A, the photo acid generator is activated in the ranges determined by the mask layout, in a first exposure step for structuring. In a subsequent, second floodlight exposure step, the total photoresist layer is exposed without the use of a photomask, and the cross-linking reagent is thus photochemically activated over the total surface of the photoresist layer. As a result of the chemical cross-linking of the photoresist which is thus initiated, its solubility is reduced. Since those parts of the photoresist which are close to the surface are more strongly exposed, they are more strongly cross-linked and hence more insoluble than the parts away from the surface. This change in the solubility is opposite to the change in solubility that is achieved in the first exposure step. While the exposed parts close to the surface have a higher solubility than the parts away from the surface as a result of the first exposure step, precisely the opposite gradient is produced by the second exposure step. Owing to the selective solubility modification in the photoresist, increased developer selectivity in the aqueous developer is achieved, resulting in steeper resist profile sidewalls.

However, this approach has a decisive disadvantage: the cross-linking reaction leads to the formation of a three-dimensional network polymer, particularly in those parts of the photoresist which are close to the surface. The network polymer has altered development behavior compared with the original, linear layer-forming polymer, which leads to "rough", i.e. inexactly defined, e.g. frayed profile sidewalls. This roughness complicates the subsequent process steps, such as, for example, the substrate etching.

SUMMARY OF THE INVENTION

It is accordingly an object of the invention to provide a method for structuring a photoresist layer which overcomes the above-mentioned disadvantages of the prior art methods of this general type, which reduces or completely avoids the disadvantages described above. In particular, it is the object of the present invention to provide a method by which highly accurate transfer of the structure predetermined by the lithography mask to a photoresist layer is achieved.

According to the invention, a method for structuring a photoresist layer is provided. A substrate to which a photoresist layer is applied at least in parts is provided. The photoresist layer contains a film-forming polymer that has molecular groups which can be converted into alkali-soluble groups by acid-catalyzed cleavage reactions. Furthermore, the polymer contains a photo acid generator that liberates an acid on exposure to light from a defined wavelength range $\Delta\lambda_1$. In addition, the polymer contains a photo base generator that liberates a base on exposure to light from a defined wavelength range $\Delta\lambda_2$. The photoresist layer is first exposed in parts to light from the defined wavelength range $\Delta\lambda_1$, the wavelength of the light being chosen so that the photo base generator is substantially inert to the irradiation. The photoresist layer is then exposed without a photomask to light from the defined wavelength range $\Delta\lambda_2$, the wavelength of the light being chosen so that the photo acid generator is substantially inert to the irradiation. The photoresist layer is then heated to a temperature at which the cleavage reaction catalyzed by the photolytically produced acid takes place and finally the photoresist layer is developed.

The wavelength ranges $\Delta\lambda_1$ and $\Delta\lambda_2$ can overlap in wide ranges. For the method according to the invention, it is merely necessary for there to be in each case at least one part-range in the wavelength range $\Delta\lambda_1$ and in the wavelength range $\Delta\lambda_2$ which is not simultaneously also in the respective other wavelength range. This makes it possible to carry out a first exposure to light from the wavelength range $\Delta\lambda_1$ in which the photo acid generator liberates an acid but the photo base generator is substantially inert to the radiation, i.e. does not liberate a base. The reason for this lies in the fact that the exposure is carried out to light whose wavelength is in the wavelength range $\Delta\lambda_1$ but substantially not in the wavelength range $\Delta\lambda_2$. Conversely, light from the wavelength range $\Delta\lambda_2$ can be used in a second exposure step, with the result that the photo base generator liberates a base but the photo acid generator is substantially inert to the radiation, i.e. does not liberate an acid. The reason for this lies in the fact that the exposure is carried out to light whose wavelength is in the wavelength range $\Delta\lambda_2$ but substantially not in the wavelength range $\Delta\lambda_1$.

The expression "substantially" is intended to make clear that the chemical substances involved, i.e. photo acid generator and photo base generator, may have low absorptions also in the respective other wavelength range, or that, depending on the radiation source used for the irradiation, radiation of low intensity may also be released in the respective undesired wavelength range.

Within the scope of the present invention, the term "alkali-soluble groups" includes all groups which increase the solubility of the film-forming polymer in alkaline solutions. This term therefore covers in particular polar, functional groups, such as, for example, carboxyl, hydroxyl and carboxamido groups, or groups which have these functional groups. Furthermore, this term is to be understood as meaning not only those groups which contribute to increased alkali solubility of the polymer but also those which additionally increase the transparency of the polymer—and hence of the photoresist layer—for light having very short wavelengths. This can be achieved by partly or completely fluorinating the groups. A suitable group is, for example, the 1,1,1,3,3,3-hexafluoro-2-hydroxy-isopropyl group, by which the transparency of the polymer is increased at a wavelength of 157 nm.

Molecular groups which can be converted into alkali-soluble groups by acid-catalyzed cleavage reactions are to be understood as meaning acid-labile groups which have only low alkali solubility and eliminate a molecular fragment through the action of acids, if required with simultaneous thermal treatment, the alkali-soluble groups being liberated on or in the polymer. This term thus covers acid-labile protective groups as regularly used in positive resists. All conventional acid-labile protective groups may be used, such as, for example, ester groups, ether groups, cyclic or acyclic acetal groups, cyclic or acyclic ketal groups, silyl ethers or cyanohydrins. Examples of suitable protective groups are mentioned, for example, in U.S. Pat. Nos. 5,932,391 or 6,114,086. The term "cleavage reaction catalyzed by the photolytically produced acid" is also to be understood in this context, i.e. the cleavage reaction takes place under the action of the photolytically liberated acid.

Molecular groups that are particularly preferred in this context are ether groups including tert-alkyl ethers, in particular tert-butyl ether, tetrahydrofuranyl ethers and/or tetrahydropyranyl ethers. The use of carboxylic esters including tert-alkyl carboxylates, in particular tert-butyl carboxylates, tetrahydrofuranyl carboxylate and/or tetrahydropyranyl carboxylate, is furthermore preferred.

Also preferred is the use of polymers that have molecular groups according to the formula II

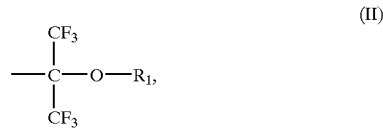

in which $R_1$ is tert-alkyl groups, in particular tert-butyl, tetra-hydrofuranyl, tetrahydropyranyl, tert-butoxycarbonyloxy or acetal groups.

In a further preferred embodiment of the method according to the invention, the molecular groups in the polymer that are capable of undergoing the acid-catalyzed cleavage reactions are groups having the structure according to the formula III, IV or V

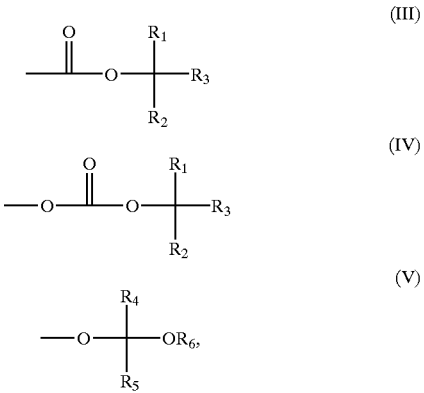

in which $R_1$, $R_2$ and $R_3$, independently of one another, are methyl, ethyl, propyl and/or butyl, and preferably $R_1$, $R_2$ and $R_3$ are methyl, and $R_4$, $R_5$ and $R_6$, independently of one another, are hydrogen, methyl, ethyl, propyl and/or butyl, with the condition that only $R_4$ or $R_5$ may be hydrogen and $R_6$ is not hydrogen.

In addition to the acid-labile groups, further groups that improve the lithographic properties or the etching resistance of the photoresist may be present in the polymer. In a particularly preferred embodiment of the present invention, the polymer additionally has further reactive groups, such as, for example, anhydride groups or succinic anhydride groups.

The reactive groups permit a subsequent chemical treatment of the resist structures, such as, for example, chemical expansion of the mask by a silylation reaction. As a result of such a chemical after treatment, the critical dimension (CD) which can be achieved in the lithographic method can be further reduced.

The nature of the main chain of the film-forming polymer is of minor importance for the present invention. Thus, all polymer types regularly used in photoresists are suitable. For example, polymers having pure carbon main chains, which can be obtained, for example, by polymerization of unsaturated monomers, such as styrenes, acrylates or methacrylates, are suitable.

Also suitable are polymers having hetero atoms in the main chains, such as, for example, polysiloxanes, polyethers or polyesters. The main chain may be composed partly or completely of fluorinated building blocks for improving the transparency of the polymer at low wavelengths.

In order to activate the photo acid generator, the photoresist layer is preferably exposed in the method according to the invention to light having a wavelength between 150 and 300 nm. Particularly fine structures can be produced in the photoresist layer by the DUV or VUV radiation (deep-ultraviolet or vacuum-ultra-violet). Alternatively, however, longer-wave light may also be used, for example having a wavelength of 300 to 450 nm, preferably 350 to 450 nm (near-ultra-violet). Therefore an overall wavelength range of 150–450 nm is provided.

In principle, all compounds that are capable of liberating an acid on irradiation may be used as photo acid generators. According to particularly advantageous embodiments of the method according to the invention, suitable photo acid are onium compounds, in particular diphenyliodonium triflate and trisulfonium nonasulfate, nitrobenzyl esters, in particular 4-nitrobenzyl 9,10-dimethoxyanthracene-2-sulfonate, sulfones, in particular phenylacyl phenyl sulfone, phosphates, in particular triaryl phosphates, N-hydroxyimido-sulfonates, in particular N-hydroxyphthalimidomethane sulfonate, and/or diazonaphthoquinones, in particular 1-oxo-2-diazonaphthoquinone-5-arylsulfonate, are used. Further suitable photo acid generators are published in Published, Non-Prosecuted German Patent Application DE 198 20 477 A.

In order to activate the photo base generator, the photoresist layer is preferably exposed to light having a wavelength between 150 and 300 nm in the method according to the invention. Alternatively, however, a longer-wave light may also be used, for example having a wavelength of 300 to 450 nm, preferably 350 to 450 nm. Therefore an overall wavelength range of 150–450 nm is provided.

In a further preferred variant of the method according to the invention, the photo base generator is O-acyloximes, in particular O-phenylacetyl-2-acetonaphthone oxime, benzoyloxycarbonyl derivatives, in particular O-nitrobenzyl N-cyclohexylcarbamate, and/or nifedipines, in particular N-methylnifedipines. Other conventional photo base generators can, however, also be used. Further examples of suitable photo base generators are listed, for example, in U.S. Pat. No. 5,650,261.

As already described, photo acid generators are used together with photo base generators in the method according to the invention, the photo acid generator liberating an acid on exposure to light from a defined wavelength range $\Delta\lambda_1$ and the photo base generator liberating a base on exposure to light from a defined wavelength range $\Delta\lambda_2$. The photo acid generator and the photo base generator must now be tailored to one another so that, on exposure to light from the wavelength range $\Delta\lambda_1$, the photo acid generator liberates the acid but the photo base generator is substantially inert to the irradiation, i.e. does not liberate a base, and conversely, on exposure to light from the wavelength range $\Delta\lambda_2$, the photo base generator liberates the base but the photo acid generator is substantially inert to the irradiation, i.e. does not liberate an acid. The discovery of such combinations of photo acid generator and photo base generator which are tailored to one another presents no difficulty for a person skilled in the art since the decomposition characteristics of the compounds as a function of the wavelength of the incident light are known.

In an advantageous embodiment of the invention, the photoresist layer is applied to the substrate by applying a solution containing a solvent, the film-forming polymer, the photo acid generator and the photo base generator to the substrate and then at least partly evaporating the solvent. In a particularly preferred embodiment of the method according to the invention, the photoresist layer is applied to the substrate by spin-coating. The solvents used may be all conventional photoresist solvents or mixtures thereof which are capable of taking up the resist components to form a clear, particle-free and storage-stable solution and ensuring a good layer quality when the substrate is coated. Suitable solvents are methoxypropyl acetate, cyclopentanone, cyclohexanone, γ-butyrolactone, ethyl lactate or mixtures of at least two of the above-mentioned solvents are particularly preferred for the method according to the invention. 1-Methoxy-2-propyl acetate is a particularly preferred solvent.

The solvent is preferably evaporated at temperatures between 60 and 160° C. In this "prebake" step, the solvent is preferably completely expelled from the photoresist.

In advantageous variants of the present invention, solutions which contain 1 to 50% by weight, preferably 3 to 20% by weight, of film-forming polymer, 0.01 to 10% by weight, preferably 0.1 to 1% by weight, of photo acid generator, 0.01 to 10% by weight, preferably 0.1 to 1% by weight, of photo base generator and 50 to 99% by weight, preferably 88 to 96% by weight, of solvent are used for applying the photoresist layer to the substrate. The sum of all components present in the solution is 100% by weight in each case.

The solution may contain, as further components, additives by which an improvement in the storage stability, in the pot life behavior, in the film formation, in the resolution, in the radiation sensitivity or in other product- or process-improving properties can regularly be achieved in photoresist layers or solutions thereof.

In the method according to the invention, the photo-resist layer is first exposed in parts to light from the defined wavelength range $\Delta\lambda_1$, the wavelength of the light being chosen so that the photo base generator is substantially inert to the irradiation. Since those parts of the photoresist that are close to the surface are more strongly exposed, a higher concentration of liberated acid is achieved in these parts. If the heating step in which the photolytically produced acid initiates the cleavage reaction and the development step have already been carried out, a flattening and poor definition of the profile sidewalls would result depending on the gradient with respect to liberated acid.

It is therefore decisive for the method according to the invention that the photoresist layer be exposed to light from the wavelength range $\Delta\lambda_2$ before the development and before the additional heating step in which the photolytically produced acid initiates the cleavage reaction. As a result of the irradiation without a photomask, the base is liberated from the photo base generator. Since, owing to the resultant light intensity profile, once again the parts close to the surface are more strongly exposed than the parts away from the surface during this exposure, a higher concentration of base is liberated in the parts close to the surface than in the parts away from the surface.

As a result of the selective neutralization reaction, the latent image in the still undeveloped photoresist layer is improved for positive resists, i.e. the distribution of the photochemically produced acid along the exposure edges becomes steeper. Consequently, after development, a substantial steepening of the resist profiles is achieved and the "roughness" of the resist sidewalls, as observed after this development in the case of the additional cross-linking of those parts of negative resists that are close to the surface, is avoided.

Of course, the neutralization reaction must not go to completion since, in such a case, no acid would be available for the subsequent cleavage reaction. In every case, therefore, an excess of acid must be present. In order to comply with this condition, the concentrations of photo acid generator and photo base generator in the photoresist layer, the respective exposure intensity during exposure to light from the wavelength range $\Delta\lambda_1$ or from the wavelength range $\Delta\lambda_2$ and/or the quantum yield with which the decomposition of photo acid generator or photo base generator is effected can be tailored to one another.

In a preferred embodiment of the method according to the invention, the photoresist layer is subjected, after the two exposure steps, to a heating step in which the photoresist layer is heated to a temperature at which the cleavage reaction catalyzed by the photolytically produced acid takes place. Preferably, the photoresist layer is heated to a temperature of 80 to 250° C. In the heating step, the acid liberated can react with the acid-labile molecular groups in the film-forming polymer and thus liberate the alkali-soluble groups on the polymer. As a result, the solubility of the polymer in alkaline solutions increases.

Alkaline solutions are preferably used for developing the exposed photoresist layer. The preferably used solvent here is water. In a particularly advantageous embodiment of the method according to the invention, a solution of 2.38% by weight of tetramethylammonium hydroxide in water is used as the developer solution.

Other features which are considered as characteristic for the invention are set forth in the appended claims.

Although the invention is described herein as embodied in a method for structuring a photoresist layer, it is nevertheless not intended to be limited to the details described, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments.

DESCRIPTION OF THE PREFERRED EMBODIMENT

A photoresist layer is applied by spin-coating to a substrate to be structured and is dried in a subsequent heating step (between 60 and 160° C.) in which a solvent can evaporate. A latent image is then produced in the resulting solid photoresist layer by exposing the photoresist layer to light having a defined wavelength. The exposure for structuring is effected at a wavelength of 248 nm through a lithography mask.

As a result of the exposure, an acid is liberated from a photo acid generator. Owing to the absorption-related reduction in the light intensity within the photoresist layer, the undesired acid distribution within the resist layer occurs, i.e. the concentration of the acid decreases continuously with an increasing distance from the surface of the photoresist layer.

This is followed by exposure to light of a wavelength of 365 nm without a photomask. As a result of the exposure, a base is liberated from a photo base generator. Owing to the absorption-related reduction in the light intensity within the photoresist layer, a gradient of the base distribution within the resist layer occurs, i.e. the concentration of the base decreases continuously with an increasing distance from the surface of the photoresist layer. This results in greater (but not complete) neutralization superficially in the resist than in parts away from the surface.

In a subsequent heating step, a "post-exposure bake (PEB)", a temperature of which is above that of the first heating step (80 to 250° C.), the functional protective groups in the film-forming polymer are cleaved by the acid produced during the exposure for structuring and, the acid is neutralized by the base.

In the parts exposed during the exposure for structuring, the resist is thus soluble in the alkaline developer. The photoresist layer is then treated, for example, with a 2.38% strength by weight aqueous tetramethylammonium hydroxide solution, with the result that the exposed parts of the photoresist layer dissolve and are removed. A positive relief pattern is thus produced in the photoresist layer, i.e. the exposed parts of the photoresist mask are removed, while the unexposed parts remain behind and can serve as a protective mask in a subsequent structuring step.

We claim:

1. A method for structuring a photoresist layer, which comprises the steps of:
   providing a substrate having a photoresist layer applied thereto at least in parts, the photo-resist layer containing:
   a film-forming polymer having molecular groups which can be converted into alkali-soluble groups by acid-catalyzed cleavage reactions;
   a photo acid generator which liberates an acid on exposure to a first light having a defined wavelength range $\Delta\lambda_1$; and
   a photo base generator which liberates a base on exposure to a second light having a defined wavelength range $\Delta\lambda_2$;
   exposing the photoresist layer in parts to the first light having the defined wavelength range $\Delta\lambda_1$, a wavelength of the first light being chosen so that the photo base generator is substantially inert to irradiation;
   exposing the photoresist layer to the second light having the defined wavelength range $\Delta\lambda_2$; a wavelength of the second light being chosen so that the photo acid generator is substantially inert to the irradiation;
   heating the photoresist layer to a temperature at which a cleavage reaction catalyzed by photolytically produced acid takes place; and
   developing the photoresist layer with an alkaline solution.

2. The method according to claim 1, which comprises heating the photoresist layer to a temperature between 80 and 25°C.

3. The method according to claim 1, which comprises exposing the photoresist layer to the first light being a UV light having a wavelength between 150 and 450 nm so that the acid is liberated from the photo acid generator.

4. The method according to claim 3, which comprises liberating the acid from the photo acid generator by exposing the photoresist layer to the first light being a UV light having a wavelength between 300 and 450 nm.

5. The method according to claim 1, which comprises liberating the base from the photo base generator by exposure to the second light being a UV light having a wavelength between 150 and 450 nm.

6. The method according to claim 5, which comprises liberating the base from the photo base generator by exposing the photoresist layer to the second light being a UV light having a wavelength between 300 and 450 nm.

7. The method according to claim 1, which comprises forming the film-forming polymer with an absorption maximum in a wavelength range between 150 and 450 nm.

8. The method according to claim 1, which comprises selecting the photo acid generator from the group consisting of onium compounds, nitrobenzyl esters, sulfones, phosphates, N-hydroxy-imidosulfonates and diazonaphthoquinones.

9. The method according to claim 1, which comprises selecting the photo base generator from the group consisting of O-acyloximes, benzoyloxycarbonyl derivatives, and nifedipines.

10. The method according to claim 1, which comprises selecting the molecular groups which can undergo the acid-catalyzed cleavage reactions to be carboxylates selected from the group consisting of tert-alkyl esters, tetrahydrofuranyl esters, tetrahydropyranyl esters, alkylcyclohexyl esters and damantyl esters.

11. The method according to claim 1, which comprises forming the film-forming polymer to contain a structure selected from the group consisting of anhydride structures and succinic anhydride structures.

12. The method according to claim 1, which comprises effecting an application of the photoresist layer to the substrate in a manner such that a solution containing a solvent, the film-forming polymer, the photo acid generator and the photo base generator is applied to the substrate and the solvent is then at least partly evaporated.

13. The method according to claim 12, which comprises selecting the solvent from the group consisting of 1-methoxy-2-propyl acetate, cyclo-pentanone, cyclohexanone, γ-butyrolactone, ethyl lactate and mixtures of at least two of the above-mentioned solvents.

14. The method according to according to claim 12, which comprises evaporating the solvent at temperatures between 60 and 160°C.

15. The method according to claim 12, which comprises forming the solution to contain 1 to 50% by weight of the film-forming polymer, 0.01 to 10% by weight of the photo acid generator, 0.01 to 10% by weight of the photo base generator and 50 to 99% by weight of the solvent.

16. The method according to claim 12, which comprises forming the solution to contain 3 to 20% by weight of the film-forming polymer, 0.1 to 1% by weight of the photo acid generator, 0.1 to 1% by weight of the photo base generator, and 88 to 96% by weight of the solvent.

17. The method according to claim 1, which comprises liberating the acid from the photo acid generator by exposing the photoresist layer to the first light being a UV light having a wavelength between 350 and 450 nm.

18. The method according to claim 1, which comprises liberating the base from the photo base generator by exposing the photoresist layer to the second light being a UV light having a wavelength between 350 and 450 nm.

19. The method according to claim 1, which comprises selecting the photo acid generator from the group consisting of diphenyliodonium triflate, trisulfonium nonasulfate, 4-nitrobenzyl 9, 10-dimethoxyanthracene-2-sulfonate, phenylacyl phenyl sulfone, triaryl phosphates, N-hydroxy-phthalimidomethane sulfonate, and 1-oxo-2-diazonaphthoquinone 5-arylsulfonate.

20. The method according to claim 1, which comprises selecting the photo base generator from the group consisting of O-phenylacetyl-2-acetonaphthone oxime, O-nitrobenzyl N-cyclohexylcarbamate, and N-methylnifedipines.

21. The method according to claim 1, which comprises selecting the molecular groups which can undergo the acid-catalyzed cleavage reactions to be ether groups selected from the group consisting of tert-alkyl ethers.

22. The method according to claim 1, which comprises selecting the molecular groups which can undergo the acid-catalyzed cleavage reactions to be from the group consisting of cyclic ketals, acyclic ketals, cyclic acetals and acyclic acetals.

23. The method according to claim 1, which comprises selecting the molecular groups which can undergo the acid-catalyzed cleavage reaction to be from butoxycarbonyloxy groups.

24. The method according to claim 1, which comprises selecting the molecular groups which can undergo the acid-catalyzed cleavage reactions to be ether groups selected from the group consisting of tert-butyl ethers, tetrahydrofuranyl ethers and tetra-hydropyranyl ethers.

25. A method for structuring a photoresist layer, which comprises the steps of:
providing a substrate having a photoresist layer applied thereto at least in parts, the photo-resist layer containing:
a film-forming polymer having molecular groups which can be converted into alkali-soluble groups by acid-catalyzed cleavage reactions;
a photo acid generator which liberates an acid on exposure to a first light having a defined wavelength range $\Delta\lambda_2$; and
a photo base generator which liberates a base on exposure to a second light having a defined wavelength range $\Delta\lambda_2$;
exposing the photoresist layer in parts to the first light having the defined wavelength range $\Delta\lambda_1$, a wavelength of the first light being chosen so that the photo base generator is substantially inert to irradiation:
exposing the photoresist layer to the second light having the defined wavelength range $\Delta\lambda_2$, a wavelength of the second light being chosen so that the photo acid generator is substantially inert to the irradiation;
heating the photoresist layer to a temperature at which a cleavage reaction catalyzed by photolytically produced acid takes place; and
developing the photoresist layer;
the molecular groups which can undergo the acid-catalyzed cleavage reactions being groups having a structure according to one of:
formula II:

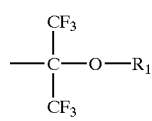

in which $R_1$ is selected from the group consisting of tert-alkyl groups, tert-butyl groups, tetrahydrofuranyl groups, tetrahydropyranyl groups, tert-butoxycarbonyloxy groups, acetal groups;

and groups having a structure according to one of formula III, IV and V:

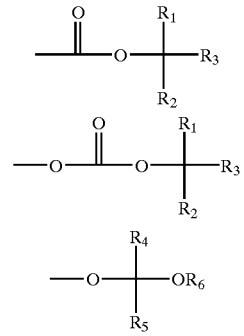

in which:
$R_1$, $R_2$ and $R_3$, independently of one another, are selected from the group consisting of methyl, ethyl, propyl and butyl; and
$R_4$, $R_5$ and $R_6$, independently of one another, are selected from the group consisting of hydrogen, methyl, ethyl, propyl and butyl with a condition that only $R_4$ and $R_5$ may be hydrogen and $R_6$ is not hydrogen.

26. The method according to claim 25, wherein $R_1$, $R_2$ and $R_3$ are methyl.

27. A method for structuring a photoresist layer, which comprises the steps of:
providing a substrate having a photoresist layer applied thereto at least in parts, the photo-resist layer containing:
a film-forming polymer having molecular groups which can be converted into alkali-soluble groups by acid-catalyzed cleavage reactions;
a photo acid generator which liberates an acid on exposure to a first light having a defined wavelength range $\Delta\lambda_1$; and
a photo base generator which liberates a base on exposure to a second light having a defined wavelength range $\Delta\lambda_2$;
exposing the photoresist layer in parts to the first light having the defined wavelength range $\Delta\lambda_1$, a wavelength of the first light being chosen so that the photo base generator is substantially inert to irradiation;
exposing the photoresist layer to the second light having the defined wavelength range $\Delta\lambda_2$, a wavelength of the second light being chosen so that the photo acid generator is substantially inert to the irradiation;
heating the photoresist layer to a temperature at which a cleavage reaction catalyzed by photolytically produced acid takes place; and
developing the photoresist layer with a solution of 2.38% by weight of tetramethylammonium hydroxide in water.

* * * * *